METHOD OF MAKING A PHOSPHOROUS-PROTECTED
SEMICONDUCTOR DEVICE

Filed July 21, 1966

INVENTORS
FRANK M. WANLASS
ROBERT M. SHULTZ
BY James and Franklin
ATTORNEY 3,438,121

METHOD OF MAKING A PHOSPHOROUS-PROTECTED SEMICONDUCTOR DEVICE

Frank M. Wanlass, Huntington, and Robert M. Shultz, Plainview, N.Y., assignors to General Instruments Corporation, Newark, N.J., a corporation of New Jersey Filed July 21, 1966, Ser. No. 566,858
Int. Cl. B01j *17/00;* H01l *5/00*
U.S. Cl. 29—578 4 Claims

ABSTRACT OF THE DISCLOSURE

A semiconductor having a thin oxide layer thereon, suitable for forming a field effect device, has a layer of phosphorous oxide formed thereon, atop which a conductive metal layer is provided, the bond between the metal and the phosphorous oxide being such as to permit the metal layer to function as an accurate mask.

The present invention relates to a method for making semiconductor devices including a phosphorous-containing layer, and in particular to a method which permits the attainment of a thin oxide layer without loss of accuracy in the fabrication of the finished device. The invention is therefore of particular significance in connection with the formation of field effect devices, where the spacing between a conductive electrode and an appropriate section of the semiconductor body must be kept to a minimum.

The efficacy of phosphorous in reducing undesired contamination of semiconductor devices is well recognized. A thin layer of phosphorous oxide, usually in the form of a glass, preferentially attracts impurities and thus prevents those impurities from entering the semiconductor body and degrading the electrical characteristics thereof. For example, in the manufacture of conventional transistors a layer of phosphorous glass is often provided on top of the semiconductor body, usually separated therefrom by an oxide layer.

Such a layer of phosphorous oxide has a characteristic which is quite undesirable. It not only attracts impurities, which is a good thing, but it also attracts moisture, and that is a bad thing. Moisture adversely affects the bond between the phosphorous oxide layer and any photoresist layer which may be placed thereupon. Moreover, the existence of the moisture, and the inherent characteristics of the phosphorous oxide itself, cause the phosphorous oxide layer to be etched more rapidly than the other oxide layers (usually silicon dioxide) which are placed atop the semiconductor body. Hence attempts to place a phosphorous oxide layer on top of a thin silicon oxide layer and then to etch a window through the superposed layers to the upper surface of the semiconductor body cannot be accurately carried out. Even if a properly patterned photoresist mask is accurately positioned on top of the phosphorous oxide layer, it will not reliably remain in position for a time sufficient to carry out the etching operation. It is therefore impractical, particularly on a production line, to thus fabricate semiconductor devices.

As a result, after the phosphorous oxide layer has been formed it has been thought necessary to cover it by another insulating layer, usually silicon oxide, and the patterned photoresist layer is then formed on top of the uppermost silicon oxide layer. With this procedure accurate and reliable positioning of the photoresist etching mask is achieved, but only at the cost of a relatively thick dielectric layer. While such thickness is acceptable for devices such as conventional transistors, it is not acceptable for field effect devices, and particularly those of the MOS type (metal oxide semiconductor) now very widely used in integrated and microcircuit assemblies.

It is the prime object of the present invention to devise a method of fabrication of semiconductor devices which permits the use of a phosphorous-containing layer in conjunction with a thin dielectric layer, but without any sacrifice in the accuracy or ease of formation of openings into or through the dielectric or oxide layers.

This can be accomplished, in accordance with the present invention, by providing on the surface of the semiconductor body a dielectric layer of a thickness appropriate to the type of device involved, after which a phosphorous-containing layer is formed thereover. Instead of attempting to place an etching mask over the thus-formed phosphorous layer (which would not reliably remain in place, for the reasons set forth above) or providing an additional dielectric layer over the phosphorous-containing layer (which would add to the thickness of the dielectric and thus limit the usefulness of the device when operating under field effect conditions), there is formed on the upper surface of the phosphorous-containing layer a layer of a conductive metal. The etching mask is formed on top of this conductive layer, to which it will remain well bonded. The conductive layer is etched substantially as readily as the dielectric layer, and consequently conventional etching techniques can produce an opening which will extend to the upper surface of the semiconductor body. Thereafter conductive metal is deposited in the opening thus formed, this metal then making appropriate electrical connection, or coming into appropriate electrical relationship, to a desired portion of the semiconductor body. The metal thus deposited in the etched opening may amalgamate with the conductive layer previously deposited, after which that conductive layer may be etched or otherwise worked upon to form a desired conductive pattern. Alternatively, by leaving the etching mask in position, the metal deposited in the opening through the dielectric layers may be electrically separated from the initially deposited conductive layer, thereby permitting the facile attainment of various types of complex electrical interconnections.

To the accomplishment of the above, and to such other objects as may hereinafter appear, the present invention relates to a method of forming a semiconductor body having a phosphorous-containing layer thereon, as defined in the appended claims and as described in this specification, taken together with the accompanying drawings, in which:

Figure 1:
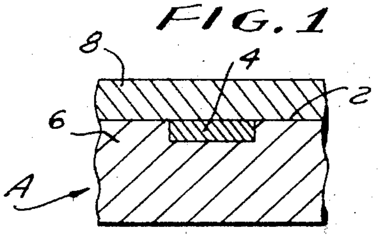
FIG. 1 is a schematic cross sectional view, enlarged and not necessarily to scale, of an exemplary embodiment of the use of the present invention, the drawing showing a semiconductor body with sections of opposite conductivity type on the surface of which a dielectric layer of appropriate thickness has been formed.

The invention is here specifically disclosed, for exemplary purposes, in connection with the fabrication of a field effect device, and in particular to one formed generally in accordance with conventional MOS techniques (the term MOS standing for "metal oxide semiconductor"). It will be understood, however, that this is solely by way of illustration, and that the invention here described in its broader aspects is applicable to the formation of other types of devices.

The field effect device here illustrated comprises, as is usual, a body generally designated A of semiconductor material of which silicon is an example, provided with source and drain regions 4 of one conductivity type extending to the upper surface 2 of the body A (only one such region is shown in the drawings) and separated by a gate region 6 of different conductivity type. Ohmic electrical connections are to be made to the source and drain regions 4. Control of the current between the source and drain regions 4 is accomplished by means of an electrode adapted to be positioned close to, but out of direct electrical connection with, the gate region 6. In general, the closer that the electrode is to the gate region 6 the more effective it is in achieving control. A layer 8 of appropriate dielectric material is formed on the surface 2 of the body A; one of its functions is to provide for the spacing between the gate electrode and the gate section 6 of the semiconductor body A. The precise composition of the layer 8 is not critical, so long as it has the desired dielectric characteristics and does not adversely affect the semiconductor body A and the regions 4 and 6 thereof. When the semiconductor body A is formed of silicon, the layer 8 is conventionally formed of silicon dioxide. For field effect devices the thickness of the silicon dioxide layer 8 may be about 1000 angstroms.

Figure 2:
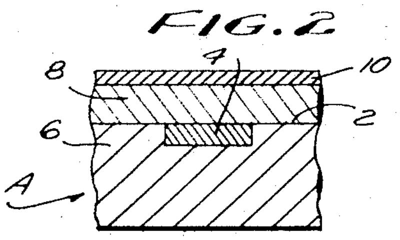
FIGS. 2–7 are views similar to FIG. 1 but showing successive stages in the course of fabrication of the unit.

As shown in FIG. 2, a phosphorous-containing layer 10 is formed on top of the dielectric layer 8. This layer 10 may be defined by phosphorous pentoxide deposited at an elevated temperature. Methods of depositing such phosphorous-containing layers are known. For example, exposure of the semiconductor body with the dielectric layer 8 thereon, at a temperature of 950° C., successively to atmospheres of argon, oxygen and then a combination of phosphine and oxygen, followed by an argon purge, has proved to be satisfactory. The thickness of the layer 10 is not critical but, for best field effect operation, is held to a minimum. The purpose of applying the phosphorous-containing layer 10, as is well known, is what is known as "gettering"—the layer 10 attracts or "gets" impurities which may be present in the dielectric layer 8 or in subsequently applied layers of material, thereby preventing those impurities from entering the semiconductor body A and adversely affecting its semiconductor characteristics and mode of functioning.

As has been indicated, ohmic connection must be made to the source and drain regions 4 and, because those regions 4 are covered by the dielectric layer 8, an opening must be made in that layer in order to expose the semiconductor region 4. This is usually done by etching through an appropriately patterned resist mask. As has been explained, if that mask is placed on the phosphorous-containing layer 10 serious manufacturing problems are presented.

Figure 3:
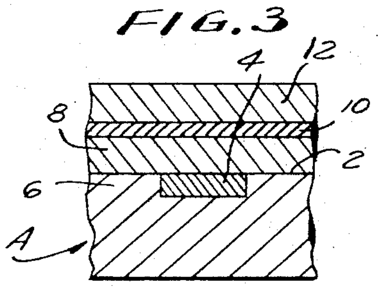

In accordance with the present invention a layer 12 of a conductive metal such as aluminum is deposited on top of the phosphorous-containing layer 10, as by a metal evaporation process (see FIG. 3). The thickness of the layer 12 is not critical, and may be varied widely.

Figure 4:
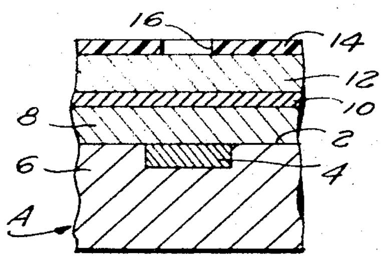

Thereafter, as indicated in FIG. 4, a masking layer 14 is formed on the upper surface of the metal layer 12, and an opening 16 is formed therein in registration with the source or drain region 4, as by conventional photolithographic techniques.

Figure 5:
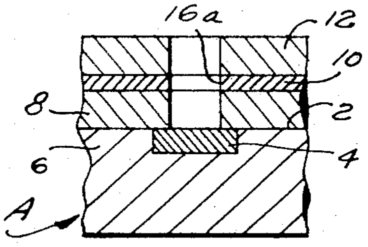

Thereafter, as indicated in FIG. 5, the assembly is subjected to a conventional etching treatment, the masking layer 14 resisting the action of the etchant but the portions of the layers 12, 10 and 8 in registration with the mask opening 16 being eaten away, thereby to form an opening 16*a* extending through the layers 12, 10 and 8 and exposing the upper surface 2 of the semiconductor body A at the source or drain region 4 thereof. Since the masking layer 14 is located on top of the metal layer 12, to which it bonds effectively and reliably, no manufacturing problems are presented insofar as maintaining the masking layer 14 in accurate position are concerned. Moreover, the layer 12 on top of the phosphorous-containing layer 10 serves to protect the layer 10 against attack by moisture, not only while the assembly is exposed to the atmosphere but also to large degree while it is exposed to the etching operation. Consequently, the phosphorous-containing layer 10 performs its desired "gettering" function but does not adversely affect the fabrication procedures.

Figure 6:
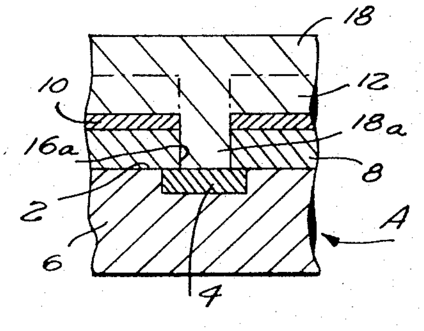
Figure 7:
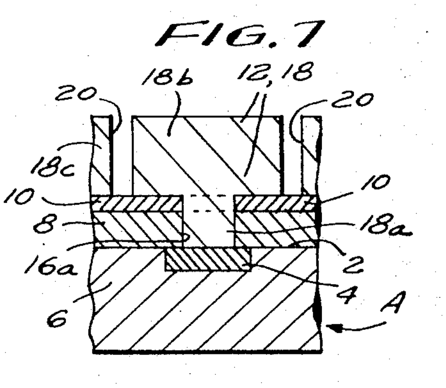

In the form specifically disclosed in FIGS. 5–7, the masking layer 14 is then removed, after which another layer 18 of conductive metal is deposited on the assembly, a portion 18*a* thereof entering and filling the opening 16*a* and thus making ohmic connection to the drain or source region 4 of the semiconductor body A, while the remainder of the layer 18 extends over and makes electrical connection with the previously deposited conductive layer 12, the dot-dash lines in FIG. 6 illustrating the boundary of the layer 12 before the layer 18 was deposited. Thereafter, as shown in FIG. 7, appropriate openings 20 are formed in the conductive layers 12–18, as by etching, thus electrically separating the section 18*b* from the section 18*c*. As a result the portion 18*b* constitutes a source or drain electrode ohmically connected to the source or drain region 4 of the semiconductor body A, while the portion 18*c* constitutes a gate electrode which is very closely spaced relative to the gate region 6 of the semiconductor body A, being separated therefrom only by the thickness of the dielectric layer 8 and the phosphorous-containing layer 10.

Thus it will be seen that by depositing the conductive layer 12 directly over the phosphorous-containing layer 10, as illustrated in FIG. 3, and thereafter etching the ohmic connection opening 16*a*, the adverse effects of the phosphorous-containing layer 10 in connection with etch-mask-adherence are eliminated, but without having to increase the spacing between the gate electrode 18*c* and the gate section 6 beyond that which is dictated by electrical considerations. The etching of the openings 20 in the combined conductive layers 12 and 18 is not, properly considered, an extra fabrication step, since it is well carried out as part of the formation of the overall metallization pattern performed in any event in making an integrated circuit assembly.

An additional advantage of the instant procedure is that there is no appreciable insulation between the phosphorous-containing layer 10 and the conductive layer 12. Such insulation, if present, might cause charge layers to develop which fould adversely affect the operation of the device.

It is preferred that at some stage in the fabrication procedure, the conductive metal layer 12 or 18 or both be subjected to an alloying step, as by subjecting it to a temperature of about 350°–550° C. for approximately 2½–5 minutes. The metal layer 12 alloys with the silicon dioxide layer 8. When this alloying step is carried out after the metal layer 12 is deposited and before the photoresist layer 14 is formed particularly good results are achieved, since impurities from the photoresist layer 14 or from the etchant are not then alloyed into an operative part of the device, as might happen if the alloying step is carried out after the second conductive layer 18 has been formed.

Figure 8:
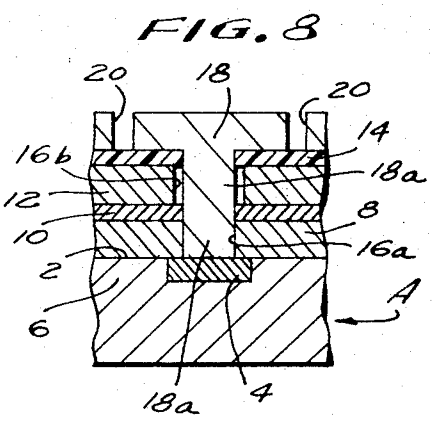
FIG. 8 is a view similar to FIG. 7 but showing an alternative embodiment.

Instead of removing the photoresist layer 14 after the etching of the opening 16*a* has been completed, one may, as illustrated in FIG. 8, leave that layer 14 in place when the conductive layer 18 is formed. In this way independent metallization patterns can be formed in the layers 12 and 18, and circuit cross-overs can be readily created. The layers 12 and 18 can be electrically separated if, as indicated in FIG. 8, care is taken during the etching of the opening 16*a* to ensure that the layer 12 is undercut with respect to the mask opening 16, as indicated at 16*b*, sufficiently so that the metal portion 18*a* will be spaced therefrom. In the embodiment of FIG. 8, if an alloying step is performed after the layer 18*a* is deposited, somewhat lower alloying temperatures, such as 350° C., should be used to prevent contamination of the semiconductor body A by etching mask 14.

It will be appreciated from the above that the manipulative steps involved are all readily carried out by means of equipment and with materials which are readily available and widely used in connection with the fabrication of conventional MOS-type devices, and that the manipulative steps themselves present no particular difficulties. As a result of the particular mode of fabrication here disclosed phosphorous-containing "gettering" layers can be used effectively with thin oxide devices without sacrificing either etching accuracy or oxide thinness.

While but a limited number of embodiments have been here specifically disclosed, it will be apparent that many variations may be made therein, both as to composition, types of devices, and particular operational conditions, all within the scope of the invention as defined in the following claims.

We claim:

1. The method of making a phosophorous-protected semiconductor field effect device having a thin oxide layer thereon which comprises forming a thin oxide layer on a surface of a semiconductor body; applying a layer thereover consisting essentially of phosphorous oxide; applying a layer of conductive metal over said phosphorous oxide layer; etching an opening through said metal and phosphorous oxide layers and into said thin oxide layer; and depositing conductive metal in said opening.

2. In the method of claim 1, applying, before said metal is deposited in said opening, an insulating layer over said layer of conductive metal; depositing said metal in said opening so as to be spaced from said layer of conductive metal; and forming a second conductive metal layer over said insulating layer and engaging with said metal in said opening.

3. In the method of claim 2, forming a conductor pattern in at least one of said layers of conductive metal.

4. In the method of claim 1, forming a conductor pattern in said layer of conductive metal.

References Cited

UNITED STATES PATENTS

| | | | |
|---|---|---|---|
| 2,916,806 | 12/1959 | Pudvin | 29—590 |
| 2,981,877 | 4/1961 | Noyce. | |
| 3,044,147 | 7/1962 | Armstrong | 29—583 |
| 3,093,882 | 6/1963 | Emeis | 29—590 |
| 3,193,418 | 7/1965 | Cooper et al. | |
| 3,241,931 | 3/1966 | Triggs et al. | |
| 3,266,127 | 8/1966 | Harding et al. | 29—578 |
| 3,287,612 | 11/1966 | Lepselter | 29—578 X |
| 3,349,300 | 10/1967 | Koepp et al. | 29—578 X |

OTHER REFERENCES

IBM Tech. Disc. Bull., vol. 8, No. 11, April 1966, pp. 1680, 1681, 1687.

WILLIAM I. BROOKS, *Primary Examiner.*

U.S. Cl. X.R.

29—589, 590; 117—5.5, 212, 217